United States Patent [19]

Shibata et al.

[11] Patent Number: 4,600,833
[45] Date of Patent: Jul. 15, 1986

[54] SOLID STATE IMAGE SENSING DEVICE WITH A COLOR FILTER

[75] Inventors: Hiroshi Shibata; Hiroyasu Toyoda; Hidefumi Nakata, all of Hyogo, Japan

[73] Assignee: Mitsubishi Denki Kabushiki Kaisha, Tokyo, Japan

[21] Appl. No.: 475,402

[22] Filed: Mar. 15, 1983

[30] Foreign Application Priority Data

Mar. 29, 1982 [JP] Japan ............................. 57-52402

[51] Int. Cl.⁴ .......................................... H01J 3/14
[52] U.S. Cl. .................................... 250/216; 250/578; 350/311
[58] Field of Search ............ 250/216, 211 J, 578; 156/659.1; 357/30, 31, 32; 29/572, 576 S; 350/311

[56] References Cited

U.S. PATENT DOCUMENTS

| 3,754,816 | 8/1973 | Ritze | 350/311 |
| 4,029,394 | 6/1977 | Araki | 350/166 |
| 4,315,978 | 2/1982 | Hartman | 430/4 |
| 4,331,506 | 5/1982 | Sasano | 156/633 |
| 4,339,514 | 7/1982 | Biber | 430/7 |
| 4,354,104 | 10/1982 | Chikamura et al. | 250/211 J |
| 4,412,236 | 10/1983 | Sasano | 357/31 |

OTHER PUBLICATIONS

European patent application No. 81300944.6, filed 6/3/81, pub. date 9/16/81.

Primary Examiner—David C. Nelms
Assistant Examiner—James Gatto
Attorney, Agent, or Firm—Lowe, Price, Leblanc, Becker & Shur

[57] ABSTRACT

A solid state image sensing device comprises a photosensitive semiconductor element having a plurality of photocells on a surface thereof. A protective layer is disposed on the photosensitive semiconductor element, and an inorganic layer is disposed on the protective layer. A plurality of color filter layers each comprising a coloring agent having a color absorption characteristic are mixed into a portion of the inorganic layer in locations overlying the photocell, and a surface protective coating is disposed on a surface of the color filter layers.

12 Claims, 10 Drawing Figures

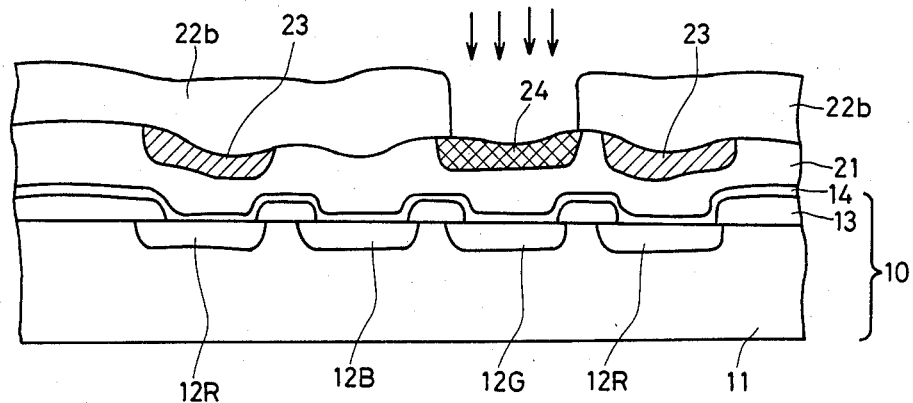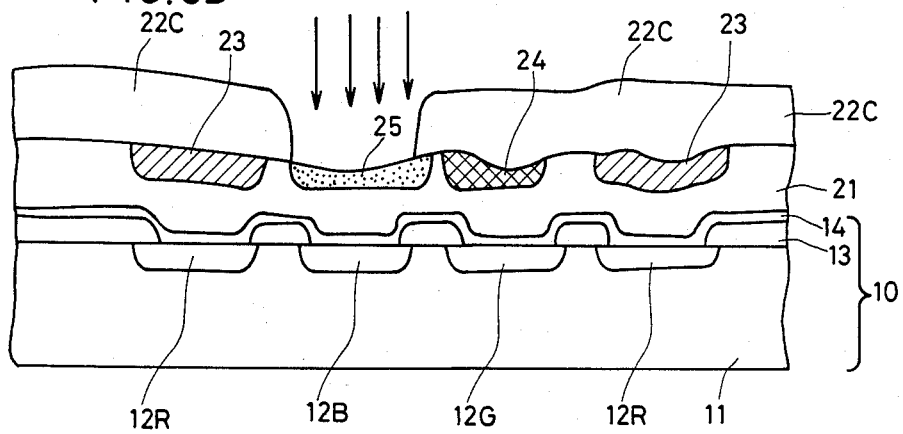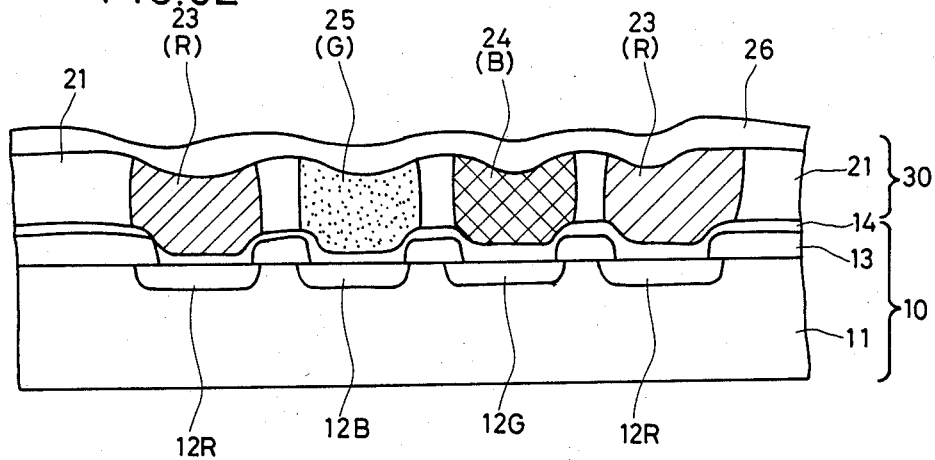

SOLID STATE IMAGE SENSING DEVICE WITH A COLOR FILTER

BACKGROUND OF THE INVENTION

1. Field of the Invention

The present invention relates to a solid state image sensing device comprising a photosensitive semiconductor element having photocells on a major surface thereof and a colored filter disposed on a major surface of the photosensitive semiconductor element.

2. Description of the Prior Art

In one of conventional designs of color image sensing devices as shown in FIG. 1, there is adhesively attached onto the front of an electron tube type image pickup tube 1, for example, sold under the name of "SACHICON", a color filter 2 consisting of a glass plate and a color coating mounted on the glass plate and comprising gelatin as its predominant component and bearing a checker pattern of the three primary colors. In FIG. 1, a lens is denoted by 3, a cathode by C and a grid by G. In another conventional type of image sensing device, the electron tube of FIG. 1 is replaced by a photosensitve semiconductor element having a substantial number of photocells and a filter carrying a color coating of the three primary colors on a glass plate is attached onto a surface of the semiconductor element in the same manner as in FIG. 1. Yet another type of conventional image sensing device is adapted such that a deposit of gelatin is formed on a major surface of a semiconductor element and desired coloring agents are mixed into the gelatin deposit for the buildup of a color filter having a checker pattern of the three primary colors.

The conventional image sensing devices described above, more particularly, the image sensing devices having the color filter on the major surface of the photosensitive semiconductor element will now be discussed in more detail with reference to FIGS. 2 and 3.

As indicated in FIG. 2, there are formed in a check pattern on a major surface 11a of a silicon substrate 11 a plurality of photocells 12R, 12B and 12G, typically, in the form of well known photodiodes. To complete a semiconductor element 10, a passivation layer 14 of typically PSG film is grown over the major surface 11a of the silicon substrate 11. In FIG. 2, a field oxide layer is denoted by 13, red, blue and green color photocells by 12R, 12B and 12G, respectively.

Subsequently, a water-soluble and photosensitive resin such as gelatin is applied over a major surface 10a of the photosensitive semiconductor element 10 and the resin is removed except on regions thereof where the red color photocells 12R are desired to be formed. Immersing a red dye in the remaining water-soluble photosensitive resin on the major surface 10a of the photosensitive semiconductor element 10 results in developing red color filter layers 15.

An isolation layer 16 is then disposed over the photosensitve semiconductor element 10 bearing the red color filter layers 15 embedded therein. In a manner similar to the manner of developing the red color filter layers 15, a blue dye is immersed into the regions of the water-soluble photosensitive resin on a surface of the isolation layer 16 which correspond to the blue color photocells 12B, thus forming blue color filter layers 17.

Furthermore, another isolation layer 18 is disposed and green color filter layers which each comprises in combination the water-soluble photosensitive resin and a green dye immersed therein are formed in regions of an upper surface of the isolation layer corresponding to the green positions where the green color photocells 12G are to be developed, in the same manner as with the development of the red color filter layers 15 and the blue color filter layers 17.

The last step to complete a solid state image sensing device of a cross-sectional view as shown in FIG. 3 is to dispose a surface protective coating 20 at the uppermost surface of the resulting device. It is noted that the red color filter layers 15, the blue color filter layers 17 and the green color filter layers 19 define as a whole a checker pattern of the three primary colors as is clear from FIG. 4 schematically showing its plan view.

The conventional solid image sensing devices as discussed above are, however, unsatisfactory in the following respects: (a) desired colors are not readily available since the predominant component of the red, blue and green color filter layers 15, 17 and 19, i.e., gelatin is albuminous, in other words, highly sensitive to heat and easily soluble in water or chemicals with a great possibility of blurring and difference in color during dying; (b) the gelatin material in the laminated structure as the predominant component would become molten and reduce in thickness in the event cleaning is done too much on the device prior to patterning for the setup of the red, blue and green color filter layers 15, 17 and 19; and (c) if cleaning is simplified to circumvent this problem, then dust and other pollutants would be left and cause a deficiency in the resulting pattern. Especially, such organic layers are liable to degenerate upon exposure to ultraviolet radiation, thus deteriorating operation life and reliability of the color image sensing device.

SUMMARY OF THE INVENTION

The principal object of the present invention is to provide an improved image sensing device which overcomes the shortcomings of the conventional devices as outlined above and particularly ensures excellent properties in resistance to heat and humidity, operation life and reliability through the disposition of color filters containing coloring agents selected from metals, sulfur or inorganic compounds on a major surface of a photosensitive body.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 5A to 5E are schematic cross-sectional views for explaining the steps of disposing a glass coating, disposing a resist pattern and mixing a red coloring agent; mixing a blue coloring agent; effecting thermal treatment and disposing a protective layer, separatively.

DETAILED DESCRIPTION OF THE PREFERRED EMBODIMENTS

Figure 1:
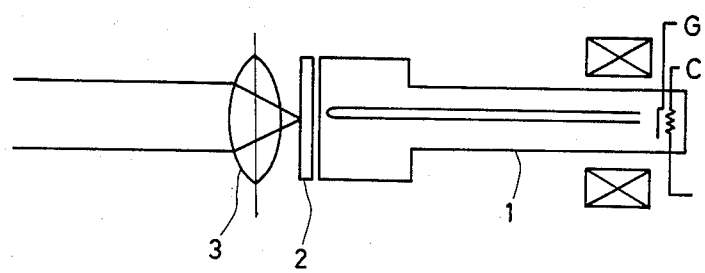
FIG. 1 is a schematic cross-sectional view of a vacuum tube type color image sensing device.
Figure 2:
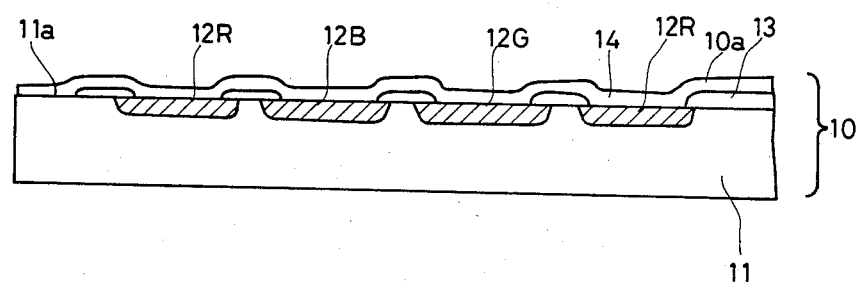
FIG. 2 is a schematic cross-sectional view of a photosensitive semiconductor element.
Figure 3:
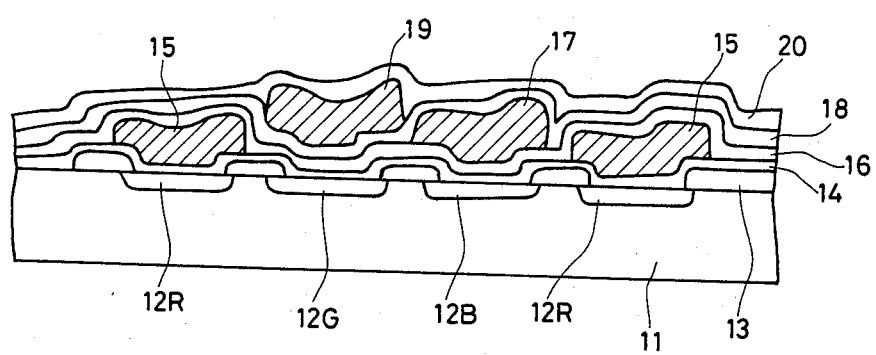
FIG. 3 is a schematic cross-sectional view of the conventional solid state image sensing device.
Figure 4:
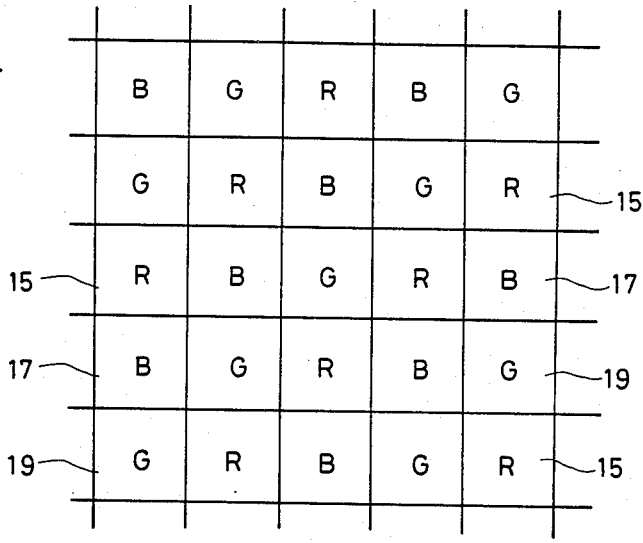
FIG. 4 is a schematic plan view of the solid state image sensing device.
Figure 5A:
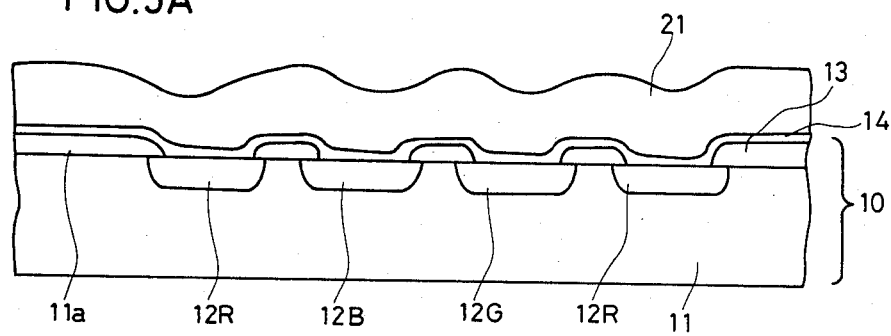

A specific embodiment of the present invention will be explained with respect to FIGS. 5A to 5E. Referring first to FIG. 5A, there are formed over a major surface 11a of a silicon substrate 11 a plurality of photosensitive cells 12R, 12B and 12G, for example, photodiodes, in a checker pattern, as is seen from FIG. 2. In the following description, the photosensitive elements so formed in the illustrated embodiment are collectively called a photosensitive semiconductor element 10. A layer of $SiO_2$ or a glass layer of typically $SiO_2$, $B_2O_3$ and $K_2O$ is grown over the whole of a major surface of the semiconductor element 10, using the conventional CVD (Chemical Vapor Deposition) method or plasma CVD method.

Figure 5B:
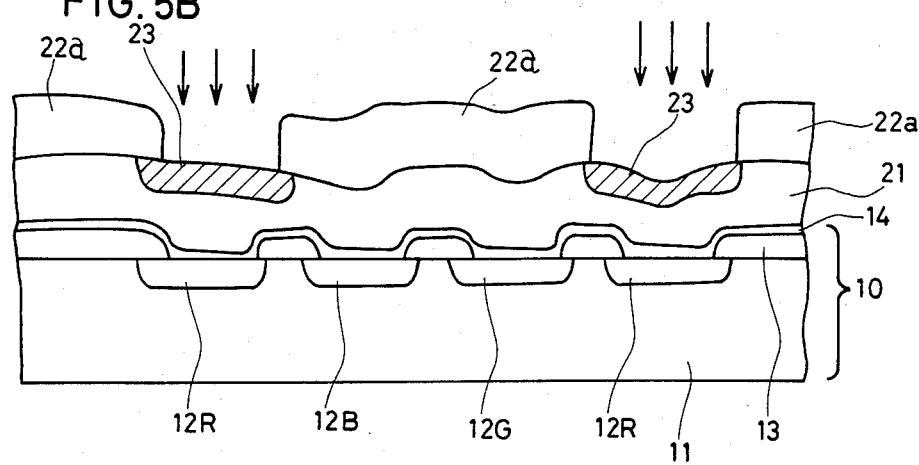

The next step is to apply a deposit of resist material 22a over the whole of an upper surface of the glass coating 21 and perforate the resist deposit 22a at only limited portions where red color photocells 12R are to be developed, by using the conventional photolithography, as seen in FIG. 5B. An oxide containing $Na_2O$, $K_2O$, ZnO, CdS and Se is then mixed as a coloring agent into the glass coating 21 by ion beam implantation or sputtering. Satisfactory red color filter regions 23 were obtained when the metals and compounds were diffused into the glass material with the following compositions: $SiO_2$ 58%, $B_2O_3$ 4.0%, $Na_2O$ 3.5%, $K_2O$ 15.5%, ZnO 18.0%, CdS 1.2% and Se 0.44%.

After removal of the whole of the resist deposit 22a which has been used for deposition of the red color filter regions 23, a fresh deposit of resist material 22b is applied and the limited portions thereof where green filter regions 24 or green color photocells 12G are desired to be formed are subsequently perforated with the photolithography in the same manner as described above with respect to the development of the red color filter regions 23. Ion beam implantation or sputtering is carried out to diffuse an oxide containing $Na_2O$, $K_2O$, CaO, ZnO, CdS and S into the glass coating 21, resulting in the growth of the green color filter regions 24 having a glass composition of $SiO_2$ 60%, $B_2O_3$ 4%, $Na_2O$ 3.0%, $K_2O$ 18.0%, CaO 11.0%, ZnO 4.0%, CdS 0.6% and S 0.2%. This exemplary composition contributes toward enriched performance of the green color filter regions.

Similarly, when blue color filter regions are to be formed, the resist deposit 22b used in developing the green color filter regions 24 is wholly removed in advance and a fresh resist coating 22c is applied again as indicated in FIG. 5D. This step of applying the resist coating is followed by the photolithography by which only the limited portions thereof where blue photocells 12B are to be formed are perforated. The subsequent step of ion implantation or sputtering introduces an oxide containing Fe, Al, Mg, Co, etc., into the glass coating 21 as a coloring agent. This results in developing blue color filter regions 25.

Thereafter, the resist coating 22c which has been used for the development of the blue color filter regions is wholly removed. To deepen coloring in the respective colors, the glass coating 21 is subjected to themal treatment, so that there is built in the glass coating 21 a colored filter structure 30 composed of the individual red, green and blue filter regions 23, 24, and 25. In other words, a coloring agent containing other metals or metal oxides is added to the glass material containing $SiO_2$, $B_2O_3$ and $K_2O$) so that the three primary colors are formed in the colored filter structure 30 or complementary colors thereof may be developed through proper choice of the coloring agent.

The solid state image sensing device is completed after positioning a membrane of protective material 26 over the whole of an upper surface of the colored filter structure 30 to secure stability of the colored filter structure 30 as depicted in FIG. 5E.

It is generally known in the art that coloring agents are applied by diffusing such metals as Cr, Mn, Fe, Co, Ni, Ce, Nd and so forth in the form of oxides. Other metal materials, for example, Cu, Ag, Au and Se, are available and inorganic compounds such as CdS and CdSe are further available for the purpose of the present invention. It is also possible to effect coloring through combination with those additives.

Whereas in the above illustrated embodiment the colored filter structure 30 is built as an integral component on the major surface of the photosensitive semiconductor element 10, it is obvious that the photosensitive semiconductor element 10 and the colored filter structure may be manufactured, separately, and then bonded together to complete a solid state image sensing device while keeping the same advantageous features as in the above embodiments.

Figure 6:
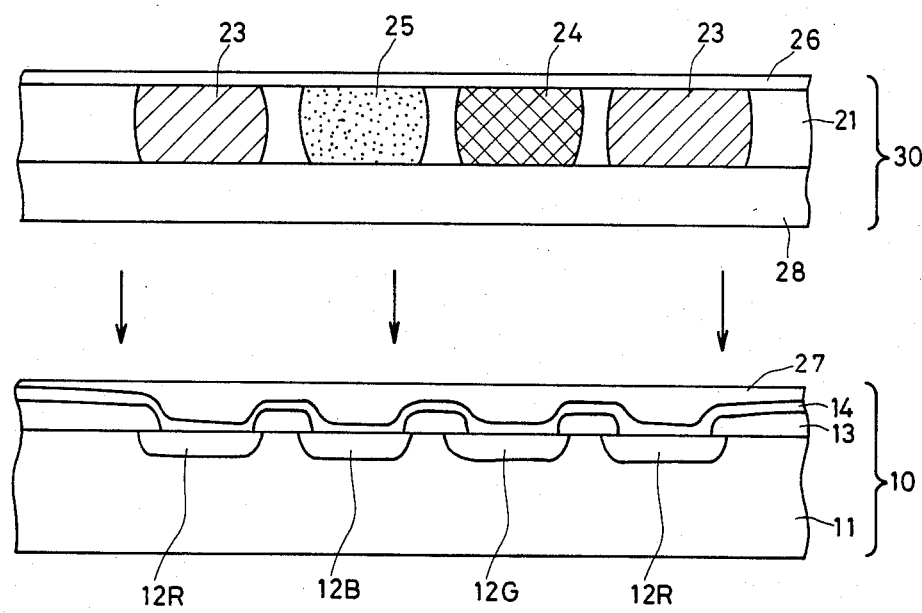

That is, as shown in FIG. 6, a glass coating 21 is disposed over a surface of a transparent plate 28 (typically glass) as in the previous embodiment and metal oxides are added to the glass coating 21 to color the same into individual colors, providing a checker filter structure composed of a plurality of red color filter regions 23, a like plurality of green color filter regions 24 and a like plurality of blue color filter regions 25. The colored filter structure 30 is covered with a protective membrane 26. Formed in a checker pattern over a major surface of a silicon substrate 11 are a plurality of photosensitive elements 12R, 12G and 12B, typically, in the form of photodiodes. A passivation layer 14 and a flattening resin layer 27 are disposed on the resulting photosensitive element to complete the manufacture of a photosensitive semiconductor element 10. Thereafter, the rear of the colored filter structure 30, that is, the rear of the transparent plate 28 is abutted against the front of the resin layer 27 on the photosensitive semiconductor element 10 for bonding such that the individual ones of the filter regions 23, 24 and 25 of the colored filter structure 30 face the individual ones of the photocells 12R, 12G and 12B of the photosensitive semiconductor element 10. This step finishes the manufacture of a solid state image sensing device.

As compared with the conventional coloring method using an organic dye including gelatin as its base material, the benefits of the present invention featuring the provision of the colored filter structure containing the coloring agents selected from metals, sulphur or inorganic compounds on the major surface of the photosensitive elements are as follows: moisture resistance is higher than that of gelatin because the base material is glass; the filter structure acts as a protective layer for the (photosensitive) semiconductor element; resistance to light is higher; and less discoloration takes place for prolonged use. Another benefit is stable and optimum coloring because precise amounts of the coloring agents may be diffused through the use of ion implantation or sputtering during the manufacture of the solid state image sensing device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid state image sensing device, comprising:
   a photosensitive semiconductor element having at least one photocell on a surface thereof;
   a transparent inorganic layer disposed on said surface to cover the photocell; and
   at least one colored filter having inorganic coloring agents contained in regions of said inorganic layer in a position overlying said photocell.

2. A solid state image sensing device, comprising:
   a photosensitive semiconductor element having at least one photocell on a surface thereof,
   a protective layer disposed on said surface,
   an inorganic layer disposed on said protective layer,
   a color filter layer comprising an inorganic coloring agent having a color absorption characteristic, said coloring agent sputtered into a portion of said inorganic layer in a location overlying said photocell, and
   a surface protective coating disposed on a surface of said color filter layer.

3. A device in accordance with claim 2 wherein said inorganic layer comprises a glass layer having as its predominant component a material selected from the group consisting of $SiO_2$ and $B_2O_3$, or a silicon nitride layer containing $Si_3N_4$ as its predominant component.

4. A device in accordance with claim 2 wherein said coloring agent includes a transition element selected from the group consisting of Cr, Fe, Co and Ni.

5. A device in accordance with claim 2 wherein said coloring agent comprises a colloidal coloring agent selected from the group consisting of Cu, Ag, Au, Se and S.

6. A device in accordance with claim 2 wherein said coloring agent comprises
   a coloring agent selected from the group consisting of CdS and combined CdS and CdSe.

7. A device in accordance with claim 2 wherein said coloring agent comprises in combination a transition element selected from the group consisting of Cr, Fe, Co and Ni, a colloidal coloring agent selected from the group consisting of Ca, Ag, Au, Se and S and an inorganic coloring agent selected from the group consisting of CdS and combined CdS and CdSe.

8. A solid state image sensing device comprising:
   a photosensitve semiconductor element having a plurality of photocells disposed in a checker pattern on a surface thereof and divided into at least three groups,
   a protective layer disposed on said surface of said photosensitive semiconductor element,
   an inorganic layer disposed on said protective layer,
   colored filter structure comprising first, second and third filter layers,
   said first filter layers including a first coloring agent mixed into regions of said inorganic layer corresponding to said photocells in the first of said at least three groups, said second filter layers including a second coloring agent mixed into regions of said inorganic layer corresponding to said photocells in the second of said at least three groups, said third filter layers including a third coloring agent mixed into regions of said inorganic layer corresponding to said photocells in the third of said at least three groups, and
   a surface protective coating disposed on a surface of said colored filter structure.

9. A device in accordance with claim 8 wherein said first filter layers are red color filter layers, said second filter layers are green color filter layers, and said third filter layers are blue color filter layers.

10. A device in accordance with claim 8 wherein
    said inorganic layer comprises a glass layer containing as its predominant component a material selected from the group consisting of $SiO_2$ and $B_2O_3$ or a silicon nitride layer containing $SiN_4$ as its predominant component.

11. A device in accordance with claim 8 wherein
    said inorganic layer comprises a glass layer containing $SiO_2$ as its predominant component, said first coloring agent in said first filter layers comprises an oxide selected from the group consisting of $Na_2O$, $K_2O$, ZnO, CdS, and Se, said second coloring agent in said second filter layers comprises an oxide selected from the group consisting of $Na_2O$, $K_2O$, CaO, ZnO, CdS, and S, and said third coloring agent in said third filter layers comprises an oxide selected from the group consisting of Fe, Al, Mg, and Co.

12. The device of claim 2, wherein said color filter layers are subjected to thermal treatment to deepen the colors of the inorganic coloring agents.